(12) United States Patent
LeClair et al.

(10) Patent No.: US 6,452,267 B1
(45) Date of Patent: Sep. 17, 2002

(54) SELECTIVE FLIP CHIP UNDERFILL PROCESSING FOR HIGH SPEED SIGNAL ISOLATION

(75) Inventors: Timothy L. LeClair; Mary Jo Nettles, both of San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 09/542,370

(22) Filed: Apr. 4, 2000

(51) Int. Cl.[7] ............................................... H01L 23/34
(52) U.S. Cl. ..................... 257/728; 257/506; 257/508; 257/522; 257/778; 257/664; 257/787; 438/421; 333/247
(58) Field of Search ................................ 257/506, 522, 257/728, 778, 788, 660, 508, 737; 438/421

(56) References Cited

U.S. PATENT DOCUMENTS

| | | | |
|---|---|---|---|
| 5,567,982 A | * 10/1996 | Bartelink | 257/664 |
| 5,604,017 A | * 2/1997 | Frankosky | 428/209 |
| 5,694,300 A | * 12/1997 | Mattie et al. | 361/818 |
| 5,768,109 A | * 6/1998 | Gullick et al. | 361/764 |
| 5,840,382 A | 11/1998 | Nashide et al. | |
| 5,889,449 A | 3/1999 | Fiedziuszko | |
| 5,982,032 A | * 11/1999 | Ishikawa et al. | 257/728 |
| 6,025,261 A | * 2/2000 | Farrar et al. | 438/619 |
| 6,141,847 A | 11/2000 | Mizuno et al. | |
| 6,184,121 B1 | * 2/2001 | Buchwalter et al. | 438/622 |
| 6,356,173 B1 | * 3/2002 | Nagata et al. | 333/247 |

* cited by examiner

Primary Examiner—Tom Thomas
Assistant Examiner—Nitin Parekh
(74) Attorney, Agent, or Firm—Gray Cary Ware & Freidenrich

(57) ABSTRACT

An integrated circuit device includes electrical conductors providing electrical communication between a substrate and a silicon chip. The silicon chip has first electronics and second electronics. The second electronics are for operating at higher frequencies than the first electronics. A first portion of electrical conductors are in communication with the first electronics and a second portion of electrical conductors are in communication with the second electronics. A first medium is positioned adjacent to the first portion of electrical conductors and a second medium is positioned adjacent to the second portion of electrical conductors. The second medium is different from the solid first medium.

47 Claims, 6 Drawing Sheets

US 6,452,267 B1

SELECTIVE FLIP CHIP UNDERFILL PROCESSING FOR HIGH SPEED SIGNAL ISOLATION

BACKGROUND

1. Field of the Invention

The invention relates generally to integrated circuit devices. In particular, the invention relates to high frequency integrated circuit devices having a reduced degree of signal degradation.

2. Background of the Invention

An integrated circuit device typically includes a substrate coupled with a silicon chip. A plurality of electrical conductors provide electrical communication between the substrate and the silicon chip. An underfill is positioned between the substrate and the silicon chip in order to provide structural integrity to the integrated circuit device.

During operation of such an integrated circuit device, electrical signals carried by the electrical conductors often exhibit varying degrees of degradation as evidenced by an increase in the bit error rate. Higher frequency signals exhibit a larger degree of degradation than lower frequency signals. This degradation often affects the ability of the integrated circuit device to process high frequency signals. As a result, there is a need for an integrated circuit device having a reduced degree of high frequency signal degradation.

SUMMARY OF THE INVENTION

The invention relates to an integrated circuit device. The device includes a substrate and a silicon chip having first electronics and second electronics, wherein the second electronics operate at higher frequencies than the first electronics. Electrical conductors provide electrical communication between the package substrate and the silicon chip. A first portion of the electrical conductors are in communication with the first electronics and a second portion of the electrical conductors are in communication with the second electronics. A first medium is positioned adjacent to the first portion of electrical conductors and a second medium is positioned adjacent to the second portion of electrical conductors. The second medium is different from the first medium.

Another embodiment of the device includes electrical conductors providing electrical communication between a substrate and a silicon chip. A solid first medium is positioned adjacent to a first portion of electrical conductors and a second medium is positioned adjacent to a second portion of electrical conductors. The second medium is different from the solid first medium.

The invention also relates to a method of forming an integrated circuit device. The method includes providing an integrated circuit device having electrical conductors providing electrical communication between a substrate and a silicon chip; and forming a solid first medium between the silicon chip and the substrate. The solid first medium is positioned adjacent to a first portion of electrical conductors and is not positioned adjacent to a second portion of electrical conductors.

In another embodiment, the method includes providing an integrated circuit device having electrical conductors providing electrical communication between a substrate and a silicon chip. The silicon chip includes first electronics and second electronics which operate at higher frequencies than the first electronics. A first portion of electrical conductors are in communication with the first electronics and a second portion of electrical conductors are in communication with the second electronics. The method also includes forming a first medium between the silicon chip and the substrate such that the first medium is positioned adjacent to a first portion of electrical conductors and is not positioned adjacent to a second portion of electrical conductors. The first medium can be a solid or a fluid.

DETAILED DESCRIPTION OF THE PREFERRED EMBODIMENT

The invention relates to an integrated circuit device which includes a plurality of electrical conductors providing electrical communication between a substrate and a silicon chip. The silicon chip includes first electronics and second electronics. The second electronics operate at higher frequencies than the first electronics. For instance, the first electronics can include control pins, a low speed data bus, power and ground, and the second electronics can include high frequency drivers and receivers. A first portion of the electrical conductors are in communication with the first electronics and a second portion of electrical conductors are in communication with the second electronics. Since the second electronics operate at a higher frequency than the first electronics, the second portion of electrical conductors carry higher frequency signals than the first portion of electrical conductors. A first medium is positioned adjacent to the first portion of electrical conductors and a second medium is positioned adjacent to the second portion of electrical conductors. The second medium preferably has a lower dielectric constant than the first medium. Additionally, the first medium and the second medium can be a fluid or a solid.

The inventors have discovered that higher frequency signals degrade due to the high dielectric constant of presently utilized underfill materials adjacent to the electrical conductors carrying the higher frequency signals. The dielectric constant of these materials is typically on the order of 4. The degradation from the use of these materials can begin to affect the performance of the silicon chip when the electrical conductors carry signals on the order of 1 GHz and higher. Positioning the first medium adjacent to the first portion of electrical conductors and the second medium adjacent to the second portion of electrical conductors allows the degree of high frequency signal degradation to be reduced. Since the second medium is adjacent to the contacts carrying the signals which tend to degrade and the second medium has a reduced dielectric constant, the degree of signal degradation is reduced.

Figure 1A:
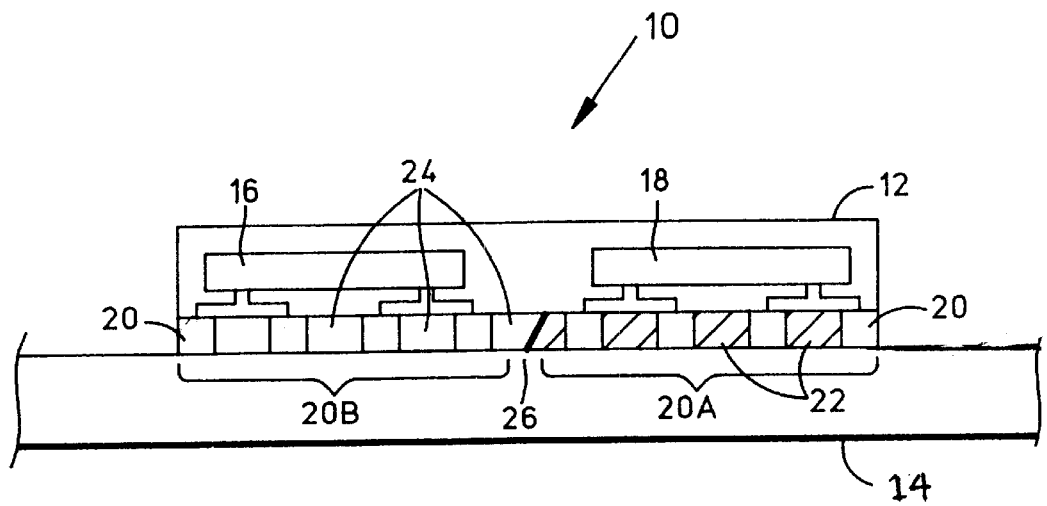
FIG. 1A is a cross section of an integrated circuit device according to the present invention.

FIG. 1A is a cross section of an integrated circuit device 10 according to the present invention. The integrated circuit device 10 includes a silicon chip 12 and a substrate 14. Suitable silicon chips 12 include, but are not limited to, a flip chip. Suitable substrates 14 include, but are not limited to, a printed circuit board. A plurality of electrical conductors 20 provide electrical communication between the substrate 14 and the silicon chip 12.

The silicon chip 12 includes first electronics 16 and second electronics 18. The second electronics 18 operate at higher frequencies than the first electronics 16. A first portion of electrical conductors 20A are in communication with the first electronics 16 and second portion of electrical conductors 20B are in communication with the second electronics 18. A first medium 22 is adjacent to the first portion of electrical conductors 20A and a second medium 24 is adjacent to the second portion of electrical conductors 20B.

The first medium is preferably an underfill material which provides structural integrity to the integrated circuit device 10. The second medium 24 preferably has a dielectric constant less than approximately 3.5, more preferably less than 3, even more preferably less than 2.5 and most preferably less than 2. Additionally, the second medium preferably has a dielectric constant which is less than the dielectric constant of the first medium. Suitable materials for the second medium include, but are not limited to, teflon (dielectric constant approximately 2.2) and cyanate esters (dielectric constant approximately 2.5–3). The second medium is most preferably ambient air since ambient air generally has a dielectric constant of approximately 1 and is not associated with high frequency signal degradation.

As described above, the second electronics operate at higher frequencies than the first electronics. Accordingly, the second portion of electrical conductors 20B carry higher frequency signals than the first portion of electrical conductors 20A. Each electrical conductor in the first portion of electrical conductors 20A preferably carries signals of at most about 2 GHz, more preferably at most about 1.5 GHz and most preferably at most 1 GHz. Hence, the first electronics preferably operate at most about 2 GHz, more preferably at most about 1.5 GHz and most preferably at most 1 GHz. Further, the electrical conductors in the second portion of electrical conductors can carry signals of any frequency. However, the second portion of the electrical conductors preferably includes all the electrical contacts which carry signals greater than about 2 GHz, more preferably greater than about 1.5 GHz and most preferably greater than about 1 GHz. Hence, the first electronics preferably include all the electronics which operate at most about 2 GHz, more preferably at most about 1.5 GHz and most preferably at most 1 GHz.

Figure 1B:
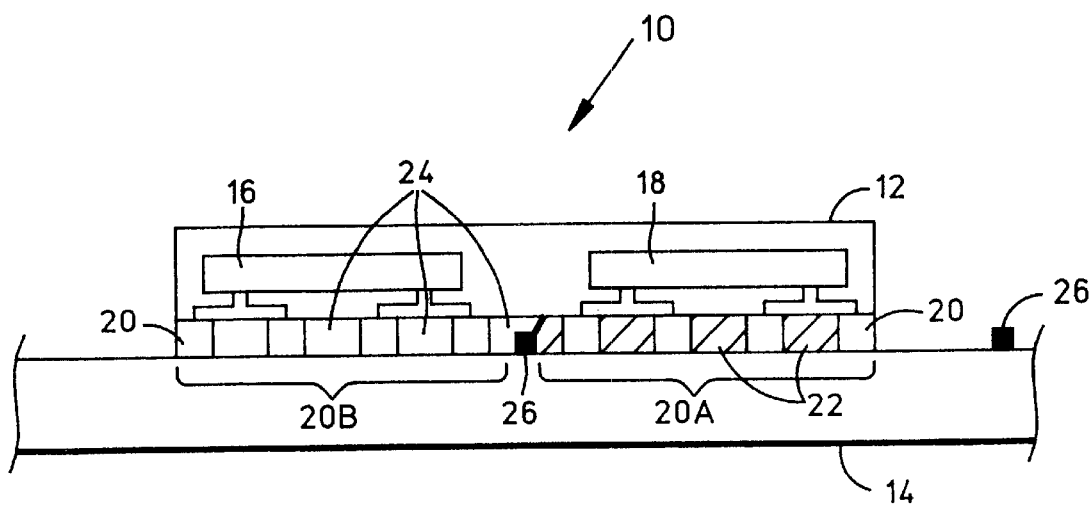
FIG. 1B is a cross section of an integrated circuit device which includes a flow limitation structure.
Figure 1C:
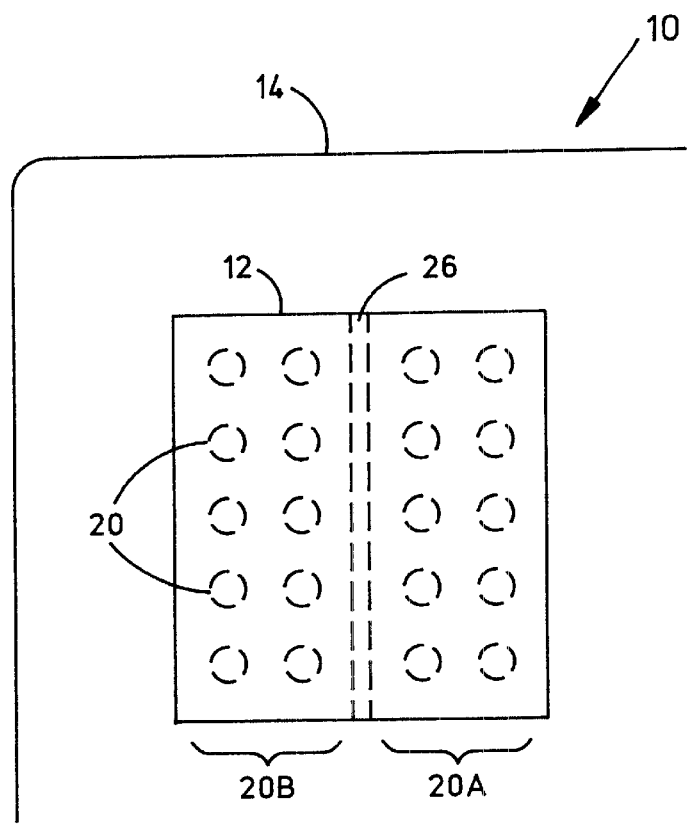
FIG. 1C is a topview of the integrated circuit device illustrated in FIG. 1B.

FIG. 1B illustrates an integrated circuit device including a flow limitation structure and FIG. 1C is a topview of the integrated circuit device 10 illustrated in FIG. 1A. The flow limitation structure 26 is positioned between the first medium 22 and the second medium 24. As illustrated, the flow limitation structure 26 need not contact the silicon chip 12, however, in some embodiments this contact may be desirable. The portion of the flow limitation structure 26 positioned between the first portion of electrical conductors 20A and the second portion of electrical conductors 20B preferably has a width on the order of one tenth to one half the distance between adjacent electrical conductors. The flow limitation structure 26 preferably has a height which approximates the distance between the silicon chip and the substrate 14 and more preferably 90% of this distance between the silicon chip and the substrate 14.

Figure 1D:
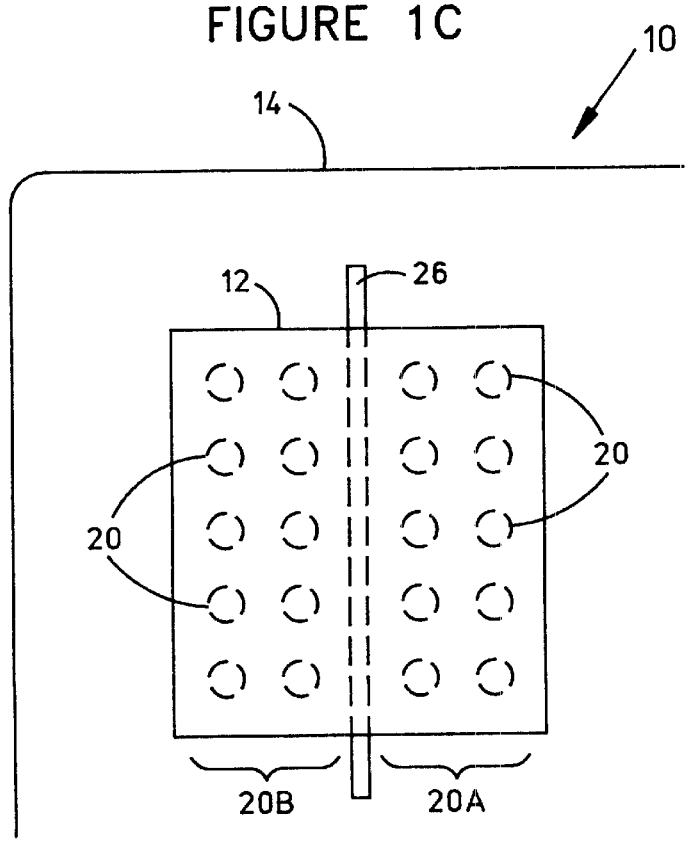
FIG. 1D is a top view of an integrated circuit having a flow limitation structure extending beyond the periphery of a silicon chip.
Figure 1E:
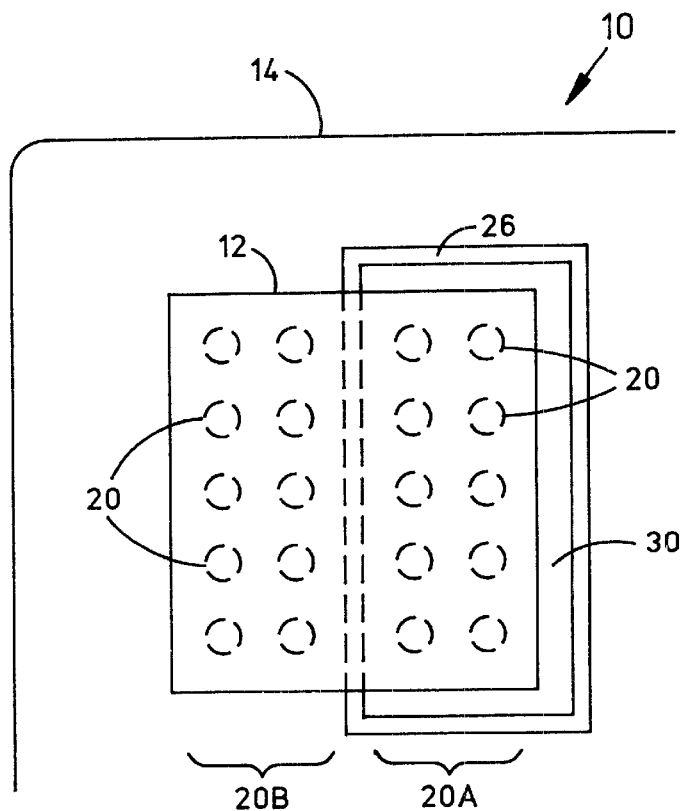
FIG. 1E is a topview of an integrated circuit device having a plurality of electrical conductors providing electrical communication between the substrate and the silicon chip. A flow limitation structure surrounds a first portion of electrical conductors.
Figure 1F:
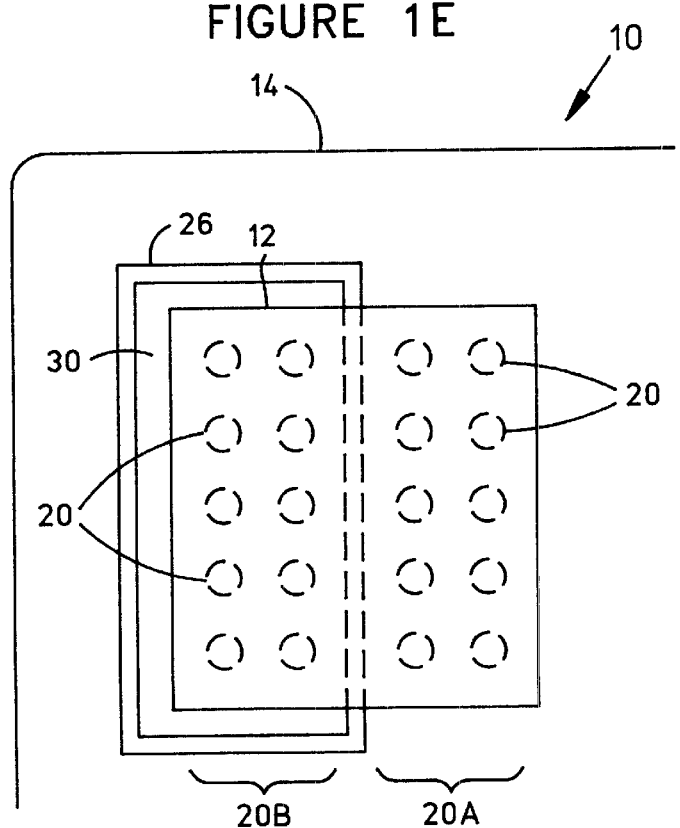
FIG. 1F is a topview of an integrated circuit device having a flow limitation structure which surrounds a second portion of the electrical conductors.
Figure 1G:
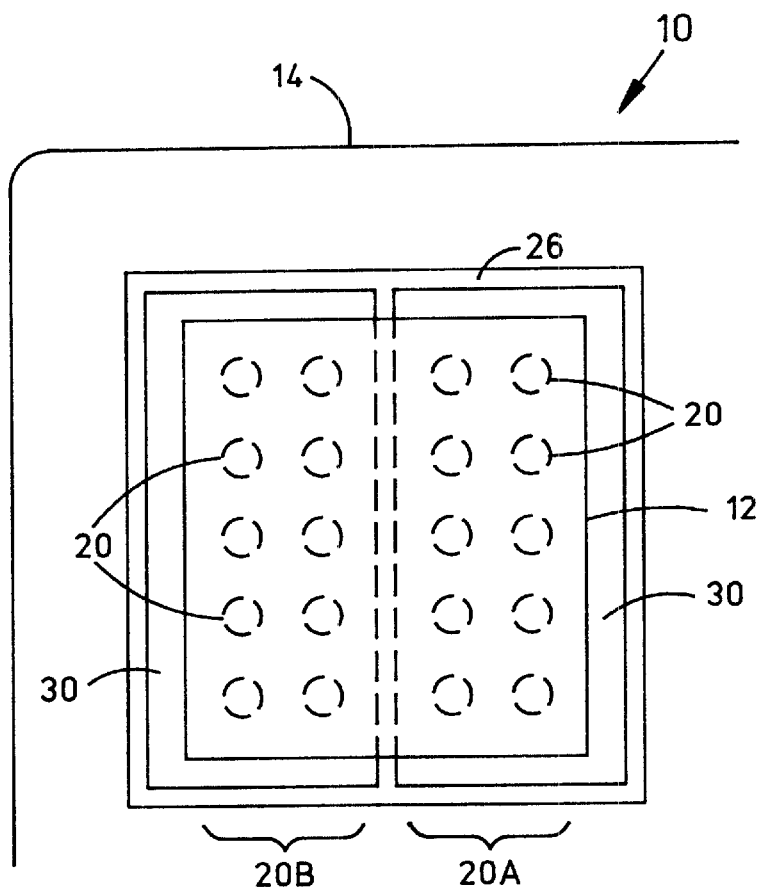
FIG. 1G is a topview of an integrated circuit device having a flow limitation structure which surrounds a first portion of the electrical conductors and a second portion of the electrical conductors.

As will be described in more detail below, the flow limitation structure 26 can be used to retain a fluid first medium precursor 40 adjacent to the first portion of electrical conductors 20A until the fluid first medium precursor 40 hardens into a solid. In FIG. 1C, the flow limitation structure 26 is flush with the perimeter of the silicon chip 12, however, the flow limitation structure 26 can extend beyond the perimeter of the silicon wafer as illustrated in FIG. 1D. Further, the flow limitation structure 26 can surround the first portion of electrical conductors 20A to create a reservoir 30 around the first portion of electrical conductors 20A as illustrated in FIG. 1E. Alternatively, the flow limitation structure 26 can surround the second portion of electrical conductors 20B as illustrated in FIG. 1F. Further, the flow limitation structure can surround both the first portion of electrical conductors 20A and the second portion of electrical conductors 20B as illustrated in FIG. 1G. When the flow limitation structure surrounds both the first and second portions of electrical conductors 20A, 20B, the flow limitation structure forms a first reservoir 30A around the first portion of electrical conductors and a second reservoir 30B around the second portion of electrical conductors.

The flow limitation structure 26 is preferably formed from a polymer and more preferably from a polymer with a tacky exterior surface. The tacky exterior surface can immobilize the flow limitation structure relative to the substrate. The flow limitation structure can also be formed from a highly viscous liquid having negligible capillary action.

Figure 2A:
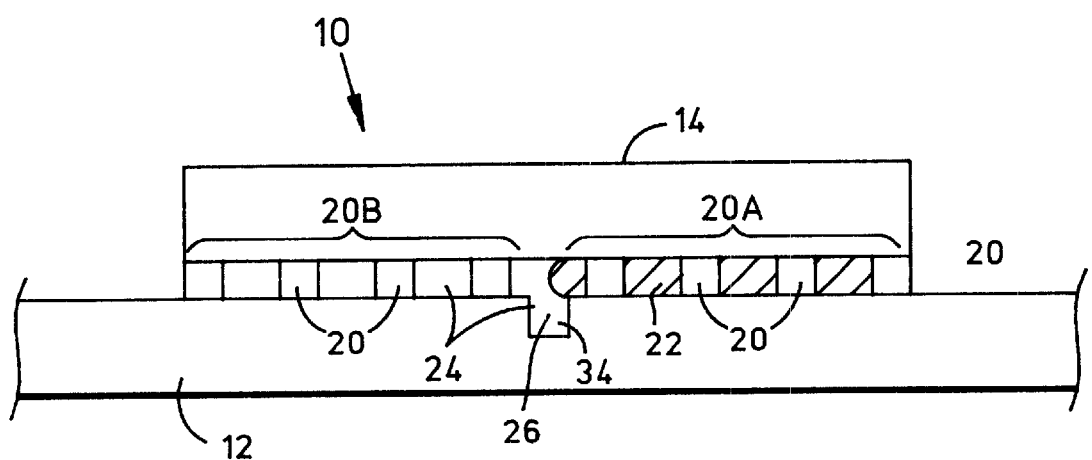
FIG. 2A is a sideview of an integrated circuit device where a recess in the substrate serves as a flow limitation structure.
Figure 2B:
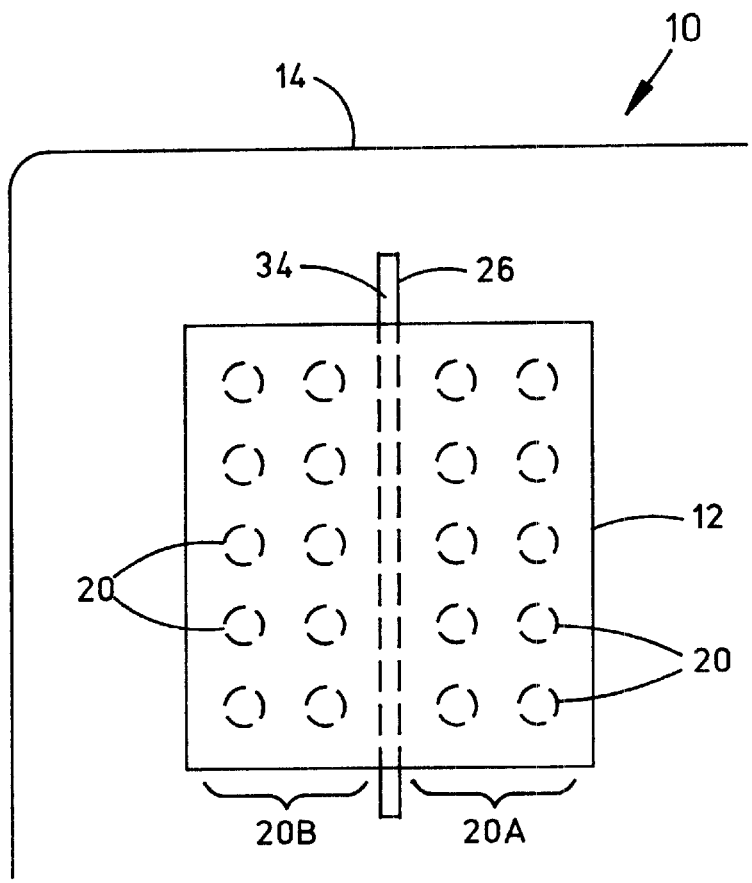
FIG. 2B is a topview of an integrated circuit device where a recess in the substrate extends beyond the periphery of the silicon chip.

FIG. 2A is a cross sectional view of a integrated circuit device 10 where the flow limitation structure 26 is a recess 34 in the substrate 14. FIG. 2B is a topview of the integrated circuit device 10 illustrated in FIG. 2A. The recess 34 is illustrated as extending beyond the perimeter of the silicon chip 12, however, the recess 34 can be flush with the silicon chip 12. The recess 34 is preferably dimensioned to decrease the capillary forces which result from the proximity of the substrate and the silicon chip. These forces are preferably reduced enough to disrupt the flow a fluid first medium and/or the flow of a fluid second medium.

Figure 3A:
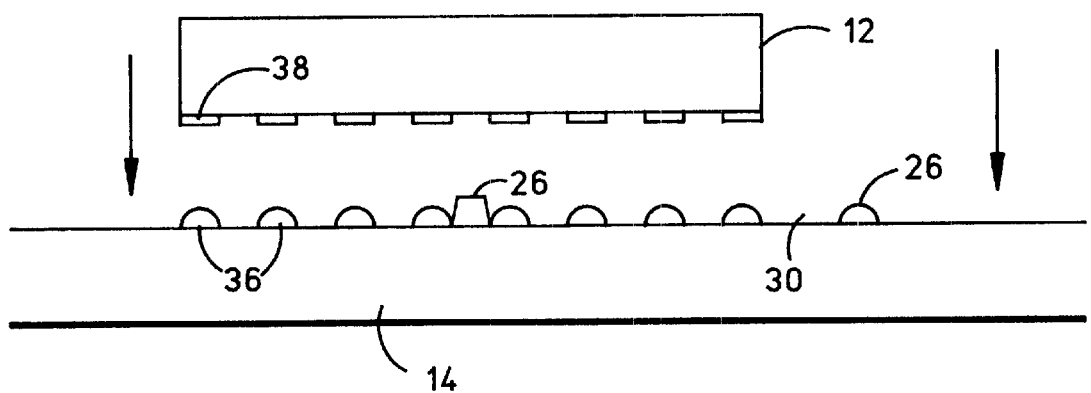
FIG. 3A illustrates alignment between solder bumps on a substrate and pads on a silicon chip.
Figure 3B:
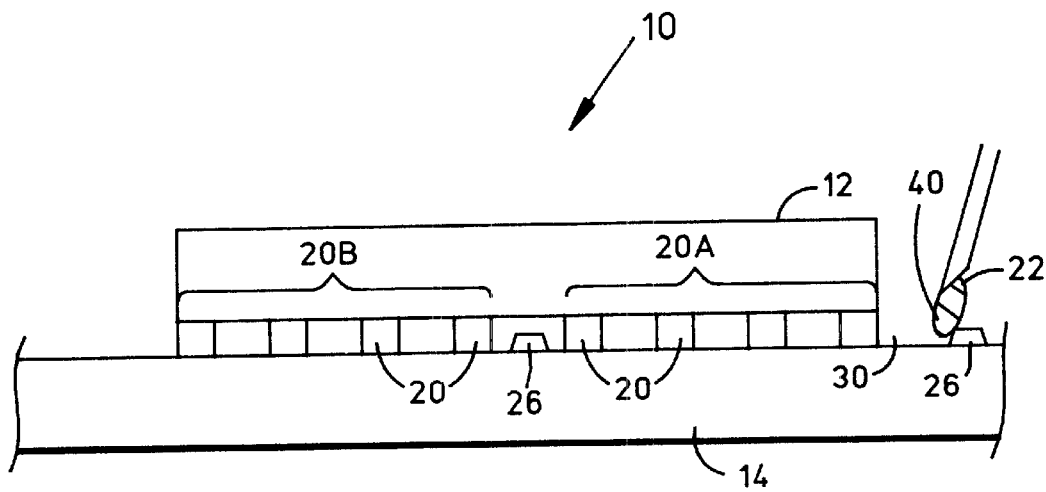
FIG. 3B illustrates a first medium precursor delivered into a reservoir formed by a flow limitation structure.
Figure 3C:
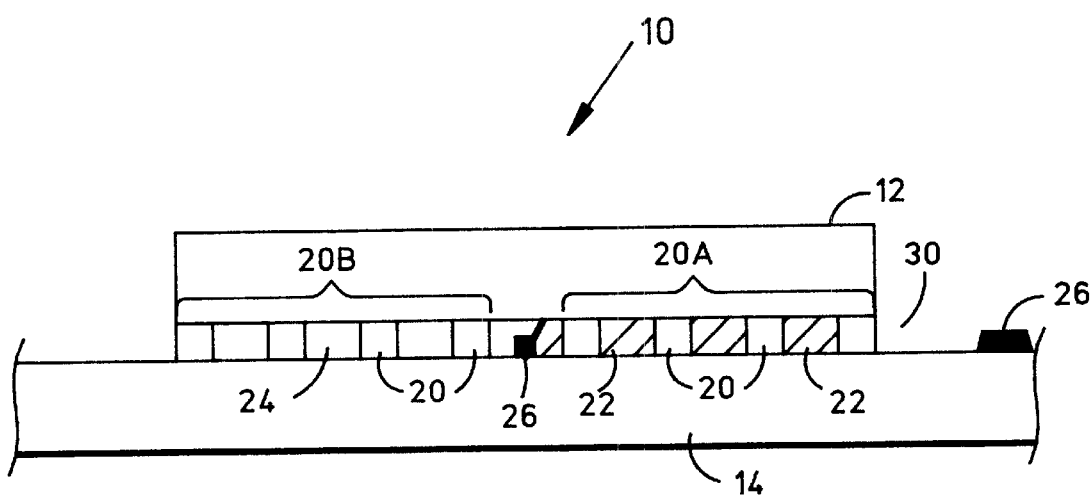
FIG. 3C illustrates the first medium precursor illustrated in FIG. 3B drawn between the substrate and the silicon chip and hardened into the first medium.

FIGS. 3A–3C illustrate a method for creating an integrated circuit device 10 according to the present invention. FIG. 3A illustrates a substrate 14 having a plurality of solder bumps 36. A flow limitation structure 26 surrounds a portion of the solder bumps 36. As described above, the flow limitation structure can have a tacky exterior which immobilizes the flow limitation structure relative to the substrate. Alternatively, the flow limitation structure 26 can be integral with the substrate 14. For instance, the flow limitation structure 26 can be a ridge on the substrate 14.

FIG. 3A also illustrates a silicon chip 12 having a plurality of pads 38. The pads 38 on the silicon chip 12 and the solder bump of the substrate 14 are aligned and soldered together to form the electrical conductors illustrated in the integrated circuit device 10 of FIG. 3B. A first medium precursor 40 is delivered into the reservoir 30 formed by the flow limitation structure 26. Suitable equipment for delivering the first medium precursor 40 into the reservoir 30 include, but are not limited to, mechanically operated syringe and pipette systems.

As illustrated in FIG. 3C, the first medium precursor 40 is drawn between the silicon chip 12 by capillary forces. The flow limitation structure 26 limits the flow of the first medium precursor 40 to the volume around the first portion of electrical conductors 20A. The first medium precursor 40 hardens into the first medium 22 positioned adjacent to the conductors in the first portion of electrical conductors 20A. A suitable first medium 22 includes, but is not limited to, infiltrant and underfill polymers such as Dexter Hysol. Suitable first medium precursors 40 are fluids which transition into a suitable first medium 22. Suitable mechanisms for the conversion from the first medium precursor 40 to the first medium 22 include, but are not limited to, hardening, drying, solidifying and/or curing.

The second medium 24 is preferably ambient air. As a result, a second medium 24 is not necessarily delivered into the volume adjacent to the second portion of electrical conductors 20B. However, a second medium precursor can be delivered into the volume adjacent to the second portion of electrical conductors 20B. When a second medium precursor is delivered into the volume adjacent to the second portion of electrical conductors 20B, the second medium 24 is preferably not associated with degradation of high frequency signals. For instance, suitable second medium precursors include, but are not limited to, Teflon PTFE type coatings which are known to have an inherently low dielectric constant.

Once the first medium 22 has hardened, the flow limitation structure 26 can be left in place on the substrate 14 or can be trimmed to be approximately flush with the silicon chip 12.

Many modifications to the method illustrated in FIGS. 3A–3D are within the scope of the present invention. For instance, a flow limitation structure can be positioned around the second portion of electrical conductors as illustrated in FIG. 1F. The first medium precursor can then be delivered adjacent to the first portion of electrical conductors. Capillary forces draw the first medium precursor between the substrate and the silicon chip. The flow limitation structure prevents the first medium precursor from flowing into the volume adjacent to the second portion of electrical conductors. As a result, the first medium precursor is delivered adjacent to the first portion of electrical conductors.

In another method according to the present invention, the flow limitation structure of FIG. 1G is employed. A first medium precursor is delivered into the first reservoir 30A and a second medium precursor is delivered into the second reservoir 30B. The first medium precursor and the second medium precursor can be delivered in any order or concurrently, or intermittently. The above methods can also employ a flow limitation structure which includes a recess as illustrated in FIG. 2A.

In another method according to the present invention, a flow limitation structure is not employed. For instance, a second medium precursor such as a Teflon PTFE type coating can be delivered adjacent to the second portion of electrical conductors and drawn between the substrate and the silicon chip by capillary action. The second medium precursor can be delivered until the second medium precursor is positioned adjacent to the second portion of electrical conductors. It is acceptable for a portion of the second medium precursor to flow into contact with a fraction of the electrical conductors included in the first portion of electrical conductors since the second medium is not associated with signal degradation. A first medium precursor can then be delivered at any location between the substrate and the silicon chip. The presence of the second medium precursor and/or the second medium adjacent to the second portion of the electrical conductors prevents the first medium from being formed adjacent to the second portion of the electrical conductors.

The method of forming the integrated circuit device can also employ a volatile second medium precursor. The volatile second medium precursor can be delivered adjacent to the second portion of electrical conductors and drawn between the substrate and the silicon chip by capillary action. The second medium precursor can be delivered until the second medium precursor is delivered adjacent to the second portion of the electrical conductors. A first medium precursor can be delivered at any location between the substrate and the silicon chip before the second medium precursor has an opportunity to vaporize. The presence of the second medium precursor and/or the second medium adjacent to the second portion of the electrical conductors prevents the first medium from contacting electrical conductors in the second portion of the electrical conductors. Over time, the second medium precursor vaporizes and is replaced by ambient air. As a result, ambient air serves as the second medium adjacent to the second portion of electrical contacts.

The above methods can be used to position more than two media between the silicon chip 12 and the substrate 14. For instance, the electrical conductors can be matched with media based upon the frequency of the signals being carried by the electrical conductors. It may be desirable for more than two media to be formed between the substrate and the silicon chip. The above methods can be adapted to position each of the identified media adjacent to the matched portion of electrical conductors.

Although the methods and integrated circuit devices illustrated above employ electrical conductors which include solder bumps, the devices and methods according to the invention can also employ other electrical conductors such as stud bumps, gold bumps, etc.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

What is claimed is:

1. An integrated circuit device, comprising:
   a substrate;
   a silicon chip including first electronics and second electronics, the second electronics for operating with higher frequency signals than the first electronics;

electrical conductors providing electrical communication between the substrate and the silicon chip, a first portion of electrical conductors in communication with the first electronics and a second portion of electrical conductors in communication with the second electronics;

a first medium positioned between the first electronics and the substrate; and a second medium positioned between the second electronics and the substrate, the second medium being different from the first medium.

2. The device of claim 1, wherein a dielectric constant of the second medium is lower than a dielectric constant of the first medium.

3. The device of claim 1, wherein the dielectric constant of the second medium is less than 3.5.

4. The device of claim 1, wherein the dielectric constant of the second medium is less than 2.5.

5. The device of claim 1, wherein the first medium includes an underfill material.

6. The device of claim 1, wherein the second medium includes a gas.

7. The device of claim 6, wherein the gas is ambient air.

8. The device of claim 1, wherein the electrical conductors are selected from a group consisting of solder bumps, stud bumps and gold bumps.

9. The device of claim 1, wherein the first medium is a fluid.

10. The device of claim 1, wherein the first portion of electrical conductors are for carrying signals of at most approximately 2 GHz.

11. The device of claim 1, wherein the first portion of electrical conductors are for carrying signals of at most approximately 1 GHz.

12. The device of claim 1, wherein the silicon chip includes a flip-chip.

13. The device of claim 1, further comprising:

a flow limitation structure positioned between the first portion of the electronic conductors and the second portion of the electronic conductors.

14. The device of claim 13, wherein the flow limitation structure is coupled with the substrate.

15. The device of claim 13, wherein the flow limitation structure surrounds the first portion of electrical conductors.

16. The device of claim 13, wherein the flow limitation structure surrounds the first portion of the electronic conductors and the second portion of the electronic conductors.

17. The device of claim 13, wherein the flow limitation structure includes a recess in the substrate.

18. An integrated circuit device, comprising:

electrical conductors providing electrical communication between a substrate and a silicon chip; and a solid first medium adjacent to a first portion of electrical conductors and between the silicon chip and the substrate; and a second medium adjacent to a second portion of electrical conductors and between the silicon chip and the substrate, the solid first medium having a first dielectric constant different from a second dielectric constant of the second medium.

19. The device of claim 18, wherein the second dielectric constant is lower than the first dielectric constant.

20. The device of claim 18, wherein the second dielectric constant is less than 3.5.

21. The device of claim 18, wherein the second dielectric constant is less than 2.5.

22. The device of claim 18, wherein the silicon chip includes first electronics and second electronics which operate on higher frequency signals than the first electronics, the first portion of the electrical conductors are in communication with the first electronics and the second portion of the electrical conductors are in communication with the second electronics.

23. The device of claim 22, wherein the second medium is associated with a lower degree of high frequency signal degradation than the first medium.

24. The device of claim 22, wherein the first electronics are for operating at less than or equal to approximately 2 GHz.

25. The device of claim 22, wherein the first electronics are for operating at less than or equal to approximately 1 GHz.

26. The device of claim 18, wherein the solid first medium includes an underfill material.

27. The device of claim 18, wherein the second medium includes a fluid.

28. The device of claim 27, wherein the gas is ambient air.

29. The device of claim 18, wherein the electrical conductors are selected from a group consisting of solder bumps, stud bumps and gold bumps.

30. The device of claim 18, further comprising:

a flow limitation structure positioned between the first portion of the electronic conductors and the second portion of the electronic conductors.

31. The device of claim 30, wherein the flow limitation structure is coupled with the substrate.

32. The device of claim 31, wherein the flow limitation structure surrounds the first portion of electrical conductors.

33. The device of claim 31, wherein the flow limitation structure surrounds the first portion of the electronic conductors and the second portion of the electronic conductors.

34. The device of claim 31, wherein the flow limitation structure includes a recess in the substrate.

35. An integrated circuit device, comprising:

a substrate;

a silicon chip including first electronics and second electronics, the second electronics for operating with higher frequency signals than the first electronics;

a first portion of electrical conductors providing electrical communication between the first electronics and the substrate;

a second portion of electrical conductors providing electrical communication between the second electronics and the substrate;

a first underfill material positioned between the first electronics and the substrate and having a first dielectric constant; and a second underfill material positioned between the second electronics and the substrate and having a second dielectric constant lower than the first dielectric constant.

36. A device in accordance with claim 35, wherein the dielectric constant of the second underfill material is less than 3.5.

37. A device in accordance with claim 35, wherein the dielectric constant of the second underfill material is less than 2.5.

38. A device in accordance with claim 35, wherein the electrical conductors are selected from a group consisting of solder bumps, stud bumps and gold bumps.

39. The device of claim 1, wherein the first underfill material is a fluid.

40. A device in accordance with claim 35, wherein the first portion of electrical conductors are for carrying signals of at most approximately 2 GHz.

41. A device in accordance with claim 35, wherein the first portion of electrical conductors are for carrying signals of at most approximately 1 GHz.

42. A device in accordance with claim 35, wherein the silicon chip includes a flip-chip.

43. A device in accordance with claim 35, further comprising:
   a flow limitation structure positioned between the first portion of the electronic conductors and the second portion of the electronic conductors.

44. A device in accordance with claim 43, wherein the flow limitation structure is coupled with the substrate.

45. A device in accordance with claim 43, wherein the flow limitation structure surrounds the first portion of electrical conductors.

46. A device in accordance with claim 43, wherein the flow limitation structure surrounds the first portion of the electronic conductors and the second portion of the electronic conductors.

47. A device in accordance with claim 43, wherein the flow limitation structure includes a recess in the substrate.

* * * * *